(12) United States Patent
Kato

(10) Patent No.: US 10,580,813 B2
(45) Date of Patent: Mar. 3, 2020

(54) IMAGE CAPTURING APPARATUS AND IMAGE CAPTURING SYSTEM

(71) Applicant: CANON KABUSHIKI KAISHA, Tokyo (JP)

(72) Inventor: Taro Kato, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/210,887

(22) Filed: Dec. 5, 2018

(65) Prior Publication Data

US 2019/0198546 A1    Jun. 27, 2019

(30) Foreign Application Priority Data

Dec. 21, 2017 (JP) ................. 2017-245451

(51) Int. Cl.
*H04N 5/369* (2011.01)
*H01L 27/146* (2006.01)
*H04N 5/378* (2011.01)
*G03B 13/36* (2006.01)

(52) U.S. Cl.
CPC .. *H01L 27/14621* (2013.01); *H01L 27/14603* (2013.01); *H01L 27/14612* (2013.01); *H01L 27/14627* (2013.01); *H01L 27/14665* (2013.01); *H04N 5/378* (2013.01); *G03B 13/36* (2013.01); *H04N 5/36961* (2018.08)

(58) Field of Classification Search
CPC ........................ H04N 5/3696; H01L 27/14603
USPC ........................................................... 348/345
See application file for complete search history.

(56) References Cited

U.S. PATENT DOCUMENTS 7,612,318 B2 * 11/2009 Jeon ................. H01L 27/14603
                                                    250/208.1
2016/0093650 A1 * 3/2016 Suzuki ............. H01L 27/14621
                                                    250/208.1

FOREIGN PATENT DOCUMENTS

JP         2015-207594 A     11/2015

* cited by examiner

*Primary Examiner* — Joel W Fosselman
(74) *Attorney, Agent, or Firm* — Canon U.S.A., Inc. IP Division

(57) ABSTRACT

One aspect relates to an image capturing apparatus that includes a plurality of pixels and a plurality of discharge electrodes. Each of the plurality of pixels includes a first electrode arranged on a member including a multilayer wiring layer, a photoelectric conversion film arranged on the first electrode, a second electrode arranged on the photoelectric conversion film, and a microlens arranged on the second electrode and in a position that overlaps with the first electrode in a plan view. Between microlenses included in adjacent two pixels of the plurality of pixels, a gap is formed in the plan view. The discharge electrode is arranged in a position that overlaps with the gap in the plan view.

16 Claims, 15 Drawing Sheets

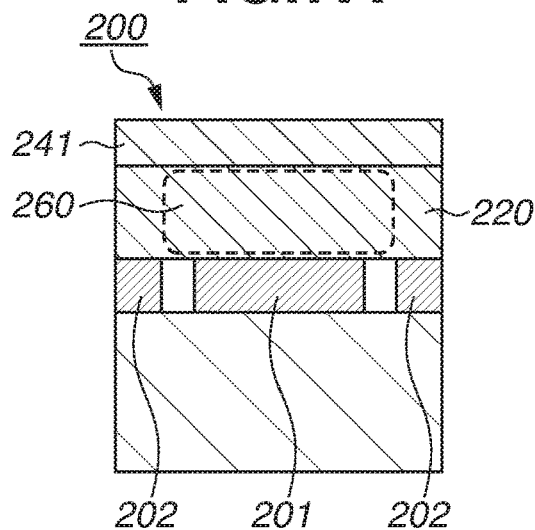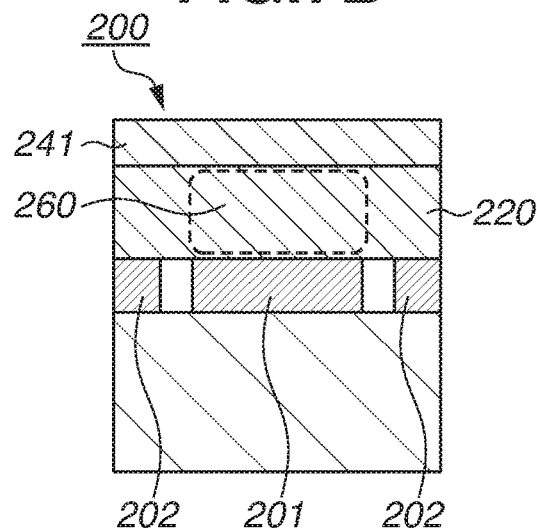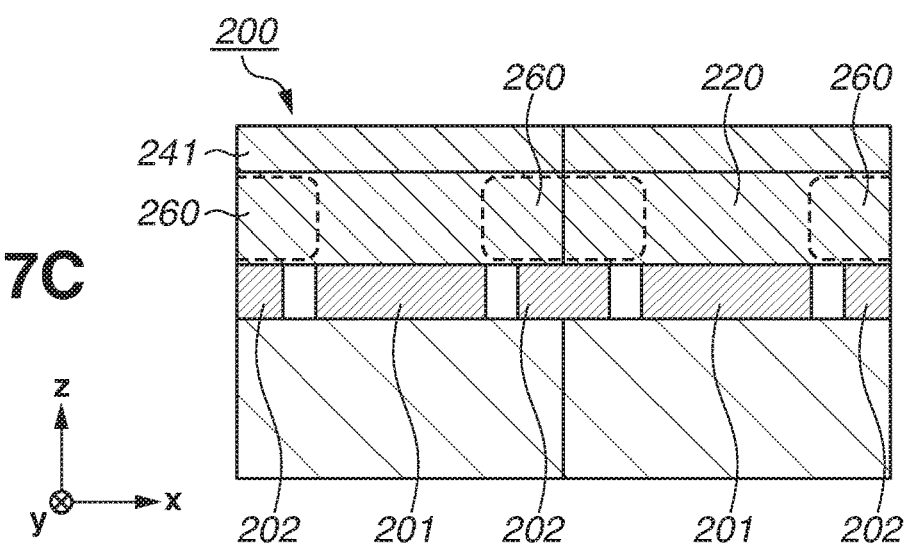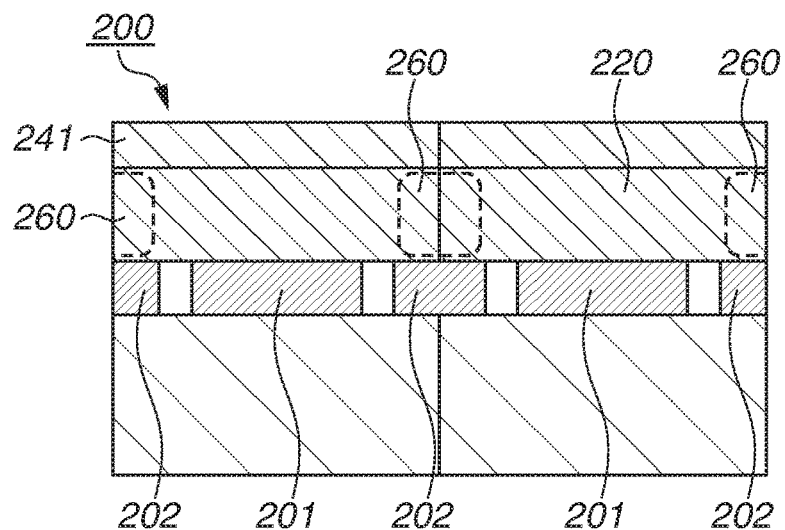

IMAGE CAPTURING APPARATUS AND IMAGE CAPTURING SYSTEM

BACKGROUND OF THE INVENTION

Field of the Invention

One disclosed aspect of the embodiments relates to an image capturing apparatus and an image capturing system.

Description of the Related Art

An image capturing apparatus in which a pixel includes a light receiving unit provided with a photoelectric conversion film is known. Japanese Patent Application Laid-Open No. 2015-207594 discusses an image capturing apparatus in which one portion of an electrode for reading out a signal charge is arranged in a lower part of a microlens.

In an image capturing apparatus including the photoelectric conversion film, if light enters into an area of a microlens gap between adjacent pixels, the light is not condensed. Consequently, the light enters into the photoelectric conversion film of the adjacent pixel, and becomes a pseudo signal. This may cause a color mixture and the like.

SUMMARY OF THE INVENTION

According to an aspect of the embodiments, an image capturing apparatus includes a plurality of pixels and a plurality of discharge electrodes Each of the plurality of pixels includes a first electrode arranged on a member including a multilayer wiring layer, a photoelectric conversion film arranged on the first electrode, a second electrode arranged on the photoelectric conversion film, and a microlens arranged on the second electrode and in a position that overlaps with the first electrode in a plan view. Between microlenses included in adjacent two pixels of the plurality of pixels, a gap is formed in the plan view. The discharge electrode is arranged in a position that overlaps with the gap in the plan view.

Further features of the disclosure will become apparent from the following description of exemplary embodiments with reference to the attached drawings.

BRIEF DESCRIPTION OF THE DRAWINGS

FIGS. 7A through 7D are diagrams illustrating the exemplary embodiment.

DESCRIPTION OF THE EMBODIMENTS

An image capturing apparatus according to an exemplary embodiment is hereinafter described with reference to the drawings. With regard to a portion that is not illustrated or described in the present specification, a conventional or publicly known technique in the technical field of such a portion is applied. Moreover, the exemplary embodiment described below is one exemplary embodiment of the disclosure, and is not limited thereto.

(Overall Configuration of Image Capturing Apparatus)

Figure 1:
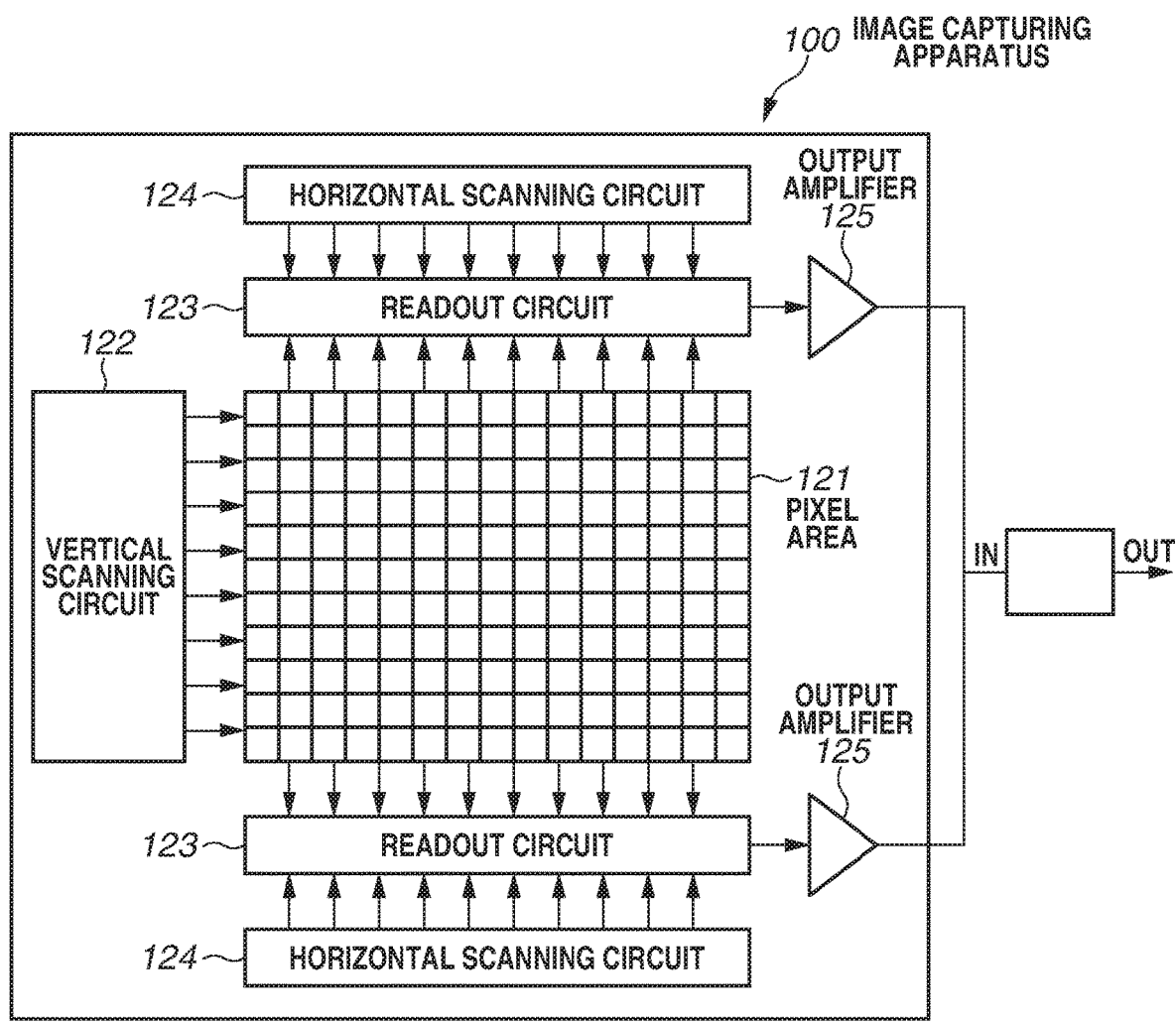
FIG. 1 is a diagram illustrating an exemplary embodiment.

A first exemplary embodiment is hereinafter described. FIG. 1 is a block diagram illustrating an image capturing apparatus 100 including a focusing pixel and an imaging pixel according to the present exemplary embodiment. In the exemplary embodiment, the image capturing apparatus 100 includes a pixel area 121, a vertical scanning circuit 122, two readout circuits 123, two horizontal scanning circuits 124, and two output amplifiers 125. An area other than the pixel area 121 is a peripheral circuit area.

The pixel area 121 includes a number of focusing pixels and imaging pixels that are two-dimensionally arranged. The peripheral circuit area includes the readout circuit 123 such as a column amplifier, a correlated double sampling (CDS) circuit, and an adding circuit. The readout circuit 123 performs, for example, amplification and addition with respect to a signal read out via a vertical signal line from a pixel in a row selected by the vertical scanning circuit 122. The horizontal scanning circuit 124 generates a signal to read out signals based on a pixel signal, in sequence from the readout circuit 123. The output amplifier 125 amplifies and outputs a signal in a column selected by the horizontal scanning circuit 124.

The present exemplary embodiment is described using an example in which an electron is used as a signal charge. However, a hole can be used as a signal charge.

(Configuration of Element of Each Pixel)

Figure 2A:
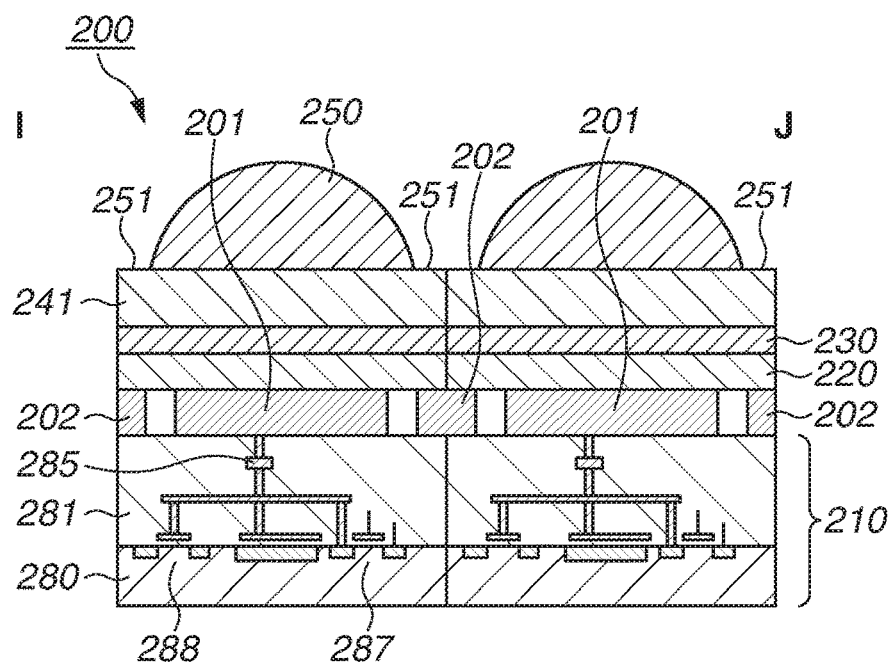
FIGS. 2A, 2B, and 2C are diagrams illustrating the exemplary embodiment.

FIG. 2A is a schematic sectional view of an electrode 202 and adjacent pixels 200 with respect to pixels 200 arranged in the pixel area 121 illustrated in FIG. 1. In FIG. 2A, a member 210 includes a substrate 280, a multilayer wiring layer 281, and a pixel-inside readout circuit. The multilayer wiring layer 281 includes a plurality of interlayer insulating layers and a plurality of wiring layers.

The substrate 280 is, for example, a silicon substrate, and includes an element such as a transistor. In the present exemplary embodiment, the -pixel-inside readout circuit of each pixel 200 includes an amplification transistor 288, a reset transistor 287, and a row selecting transistor 401 (omitted in FIG. 2A).

The multilayer wiring layer 281 includes an electrode of the transistor, a contact plug, a via plug, a wiring for electrical connection with a transistor, and an interlayer insulating layer that insulates these elements against one another. As for the contact plug, the via plug, and the wiring, for example, a conductor including aluminum, copper, and tungsten can be used. As for the interlayer insulating layer, for example, an insulation film including silicon oxide and silicon nitride or a lamination of silicon oxide and silicon nitride can be used.

On the member 210, an electrode 201 serving as a lower electrode and the electrode 202 for discharge are provided. A photoelectric conversion film 220 is arranged on the electrode 201 and the electrode 202, and a counter electrode 230 serving as an upper electrode is arranged on the photoelectric conversion film 220. A color filter 241 is arranged on the counter electrode 230.

A microlens 250 corresponding to the electrode 201 is arranged on the color filter 241. A planarization layer can be arranged between the color filter 241 and the microlens 250. The microlens 250 is formed using a material such as resin.

Figure 2B:
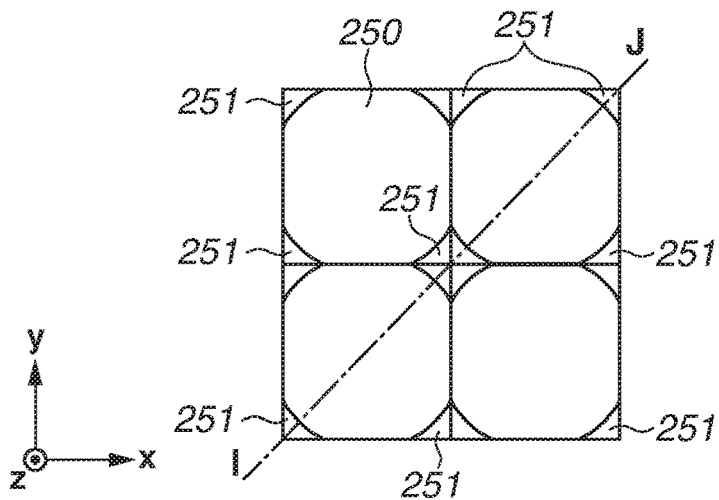
Figure 2C:
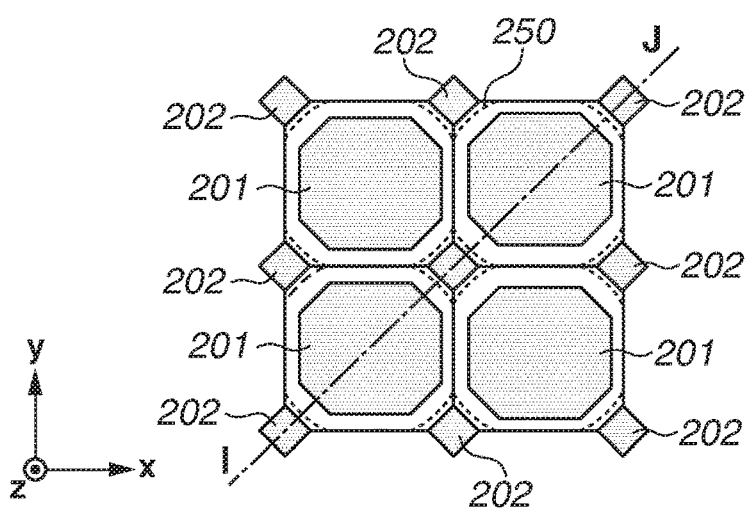

FIG. 2B is a top view (an x-y surface) of the microlens 250. FIG. 2C is a top view (an x-y surface) of the electrodes 201 and 202. In FIG. 2C, the microlens 250 is indicated by a broken line. The sectional view illustrated in FIG. 2A corresponds to a surface along the dashed line I-J of each of FIGS. 2B and 2C.

Herein, one portion of the components illustrated in the sectional view is omitted. The one portion of the components includes the color filter 241. In the cross section along the dashed line I-J, there is a gap 251 between two microlenses 250.

Each of the electrodes 201 and 202 is a thin film electrode, and is formed of a conductive member such as aluminum and copper. The photoelectric conversion film 220 is made of an inorganic compound material or an organic compound material that generates an electric charge according to an amount of incident light. The electrodes 201, 202, and the counter electrode 230 apply voltage to the photoelectric conversion film 220 to generate an electric field in the photoelectric conversion film 220. Since the counter electrode 230 is arranged on a light incidence surface side relative to the photoelectric conversion film 220, the counter electrode 230 includes a conductive material such as transparent indium tin oxide (ITO) with respect to the incident light.

In the top view as illustrated in FIG. 2B, the microlens 250 includes the gap 251 between adjacent pixels in a diagonal direction. In particular, a plurality of microlenses 250 can be separated from each other in a diagonal direction (a direction along the dashed line I-J) (FIG. 3B). Moreover, a plurality of microlenses 250 can be connected therebetween as a microlens layer of a single layer. The separation of the microlens 250 forms the gap 251. The gap 251 represents an area that has substantially no power of the microlens 250 (an area that does not substantially function to condense light to the photoelectric conversion film 220).

The electrode 202 is arranged between the member 210 and the photoelectric conversion film 220. As illustrated in FIG. 2C, in a plan view, the electrode 201 is arranged in a position that overlaps the microlens 250, and the electrode 202 is arranged below (in a position that overlaps) the gap 251.

Among electric charges generated in the area of the photoelectric conversion film 220, the electric charge generated on the electrode 202 can be discharged from the electrode 202. Among electric charges generated in an area of the photoelectric conversion film 220, the electric charge generated on the electrode 201 can be output from the electrode 201. A captured image can be obtained based on the output (signal) acquired from the electrode 201. That is, a signal from the electrode 201 can serve as a signal for image formation.

The light entering from the gap 251 is barely bent by the microlens 250, and enters the photoelectric conversion film 220 near the electrode 202. Herein, since light that has entered from the gap 251 is not condensed by the microlens 250, the light may enter the photoelectric conversion film 220 in a pixel that is not a corresponding pixel. In such a case, the light may be photoelectrically converted. Since an electric charge generated in such a way is output as a signal in a pixel different from an appropriate pixel, a pseudo signal is produced and causes a color mixture, for example.

On the other hand, in the present exemplary embodiment, the electrode 202 for discharge is arranged below the gap 251 of the microlens 250. Thus, an electric charge that is photoelectrically converted in a portion of the photoelectric conversion film 220 overlapping with the gap 251 can be discharged from the electrode 202, based on light that has entered from the gap 251. Hence, a color mixture can be prevented.

Alternatively, electrodes for discharge may be provided in a grid-like pattern across an area between adjacent pixels to prevent a color mixture. In such a case, however, the electrode 201 for signal detection is arranged in only a middle portion within the pixel 200. This degrades oblique-incidence sensitivity. On the other hand, according to the present exemplary embodiment, arrangement of the electrode 202 below the gap 251 of the microlens 250 can prevent degradation in oblique-incidence sensitivity.

Accordingly, the electrode 202 for discharge can be arranged in a position that overlaps with the gap 251 and does not overlap with the microlens 250 in a plan view. However, the image capturing apparatus according to the present exemplary embodiment is not limited to such a configuration. One portion of the electrode 202 for discharge may overlap with the microlens 250. Even in such a case, for example, by adjusting voltages to be applied to the electrode 202 and the counter electrode 230, an area in which a signal is discharged as a pseudo signal by the electrode 202, and an area from which a signal is extracted as a signal for image formation in the photoelectric conversion film 220, can be controlled as described below.

Moreover, an electrode for discharge may be an electrode having a light-shielding property, and such an electrode may be arranged in an upper portion (on the light incidence surface side) relative to the photoelectric conversion film 220 to prevent a color mixture. In such a case, however, if one portion of the electrode 202 for discharge is arranged in a position that overlaps with the microlens 250 in a plan view, such arrangement causes degradation in sensitivity. According to the present exemplary embodiment, on the other hand, the electrodes 201 and 202 are arranged in a lower portion (on a substrate side) relative to the photoelectric conversion film 220, thereby preventing degradation in sensitivity.

Moreover, it is conceivable that a gapless microlens that eliminates the gap 251 between the microlenses 250 between adjacent pixels 200 may be used to prevent a color mixture between the adjacent pixels. However, if a height of the microlens 250 is increased to strength power of the microlens 250 (to reduce a radius of curvature) for enhancement of the sensitivity, a gap is more easily generated between adjacent pixels, particularly between adjacent pixels in a diagonal direction. This causes difficulty in using the gapless microlens. Therefore, the use of the configuration according to the present exemplary embodiment can prevent a color mixture while enhancing sensitivity.

Next, an equivalent circuit of the electrode 202 for discharge and one pixel 200 of the image capturing apparatus according to the present exemplary embodiment is described with reference to FIG. 3A. The pixel 200 includes the electrode 201, the photoelectric conversion film 220, the counter electrode 230, and an inside-pixel readout unit. The inside-pixel readout unit includes the reset transistor 287, the amplification transistor 288, and the row selecting transistor 401. The inside-pixel readout unit may not necessarily include the row selecting transistor 401. Moreover, an optional configuration can be added. Examples of the optional configurations include arrangement of a transfer transistor between the electrode 201 and the amplification transistor 288, and arrangement of a capacitor between the electrode 201 and the amplification transistor 288. The row selecting transistor 401 is connected to a signal line 402, and the signal line 402 is connected to the readout circuit 123 illustrated in FIG. 1. The amplification transistor 288 constitutes a current source (a constant current source in the present exemplary embodiment) arranged on the signal line 402, and a source follower circuit.

A control signal PRES is input to a gate of the reset transistor 287. One terminal of the reset transistor 287 is connected to the electrode 201, and the other terminal of the reset transistor 287 is connected to a wiring VRES. A gate of the amplification transistor 288 is connected to the electrode 201 and one terminal of the reset transistor 287. One terminal of the amplification transistor 288 is connected to a wiring SVDD, and the other terminal of the amplification transistor 288 is connected to one terminal of the row selecting transistor 401.

A control signal PSEL is input to a gate of the row selecting transistor 401, and the other terminal of the row selecting transistor 401 is connected to a signal line SIG. The counter electrode 230 is connected to a wiring Vtop. Although the electrode 202 for discharge is omitted in the sectional view illustrated in FIG. 2A, the electrode 202 is being connected to a wiring L1.

In the configuration illustrated in FIGS. 2A, 2B, 2C, 3A, and 3B, the electrode 202 is small relative to the gap 251 in a plan view. However, as illustrated in FIGS. 4A, 4B, and 4C, the electrode 202 can be large relative to the gap 251. Size of the electrode 202 can be increased, so that light that has spread and entered from the gap 251 enables a converted electric charge to be efficiently discharged from the electrode 202. This can further prevent a color mixture.

Moreover, the image capturing apparatus illustrated in FIGS. 2 through 4 does not include the electrode 201 below the gap 251 in a plan view. That is, the electrode 201 does not overlap with the gap 251. This can prevent a color mixture due to intrusion of the electric charge generated by light that has entered from the gap 251 into the electrode 201.

Figure 4A:
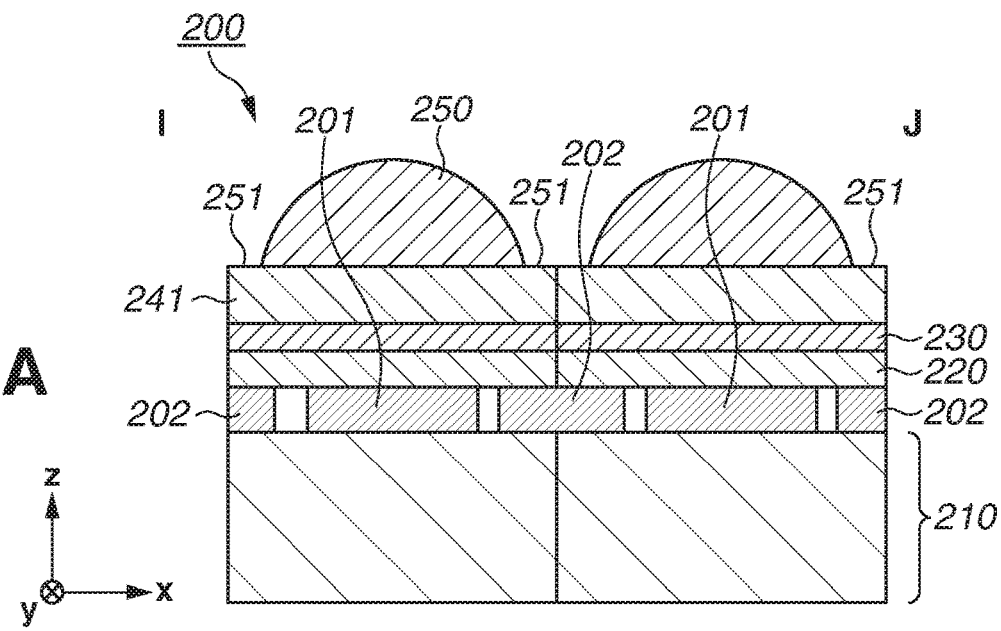
FIGS. 4A, 4B, and 4C are diagrams illustrating the exemplary embodiment.
Figure 4B:
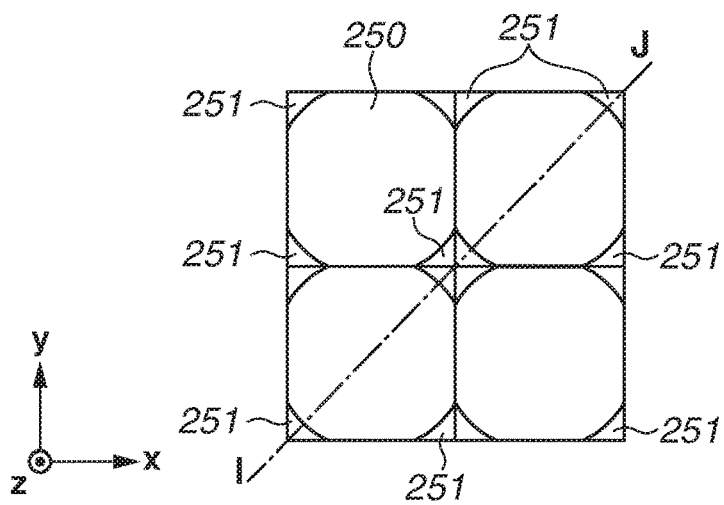
Figure 4C:
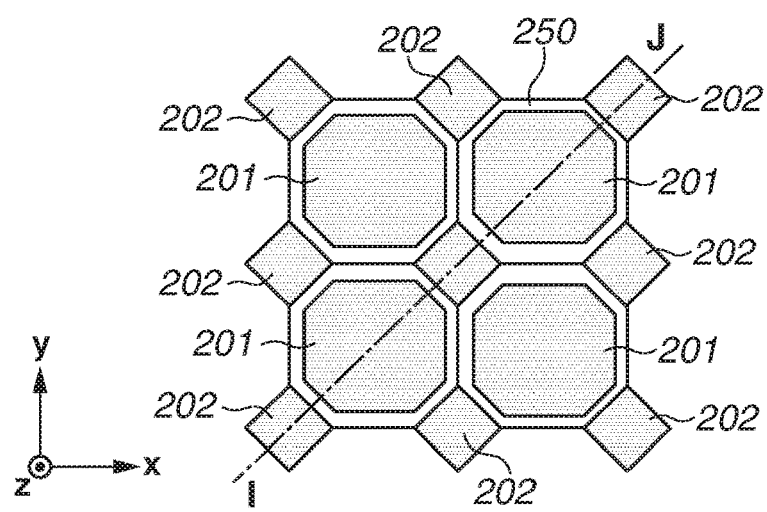
Figure 5A:
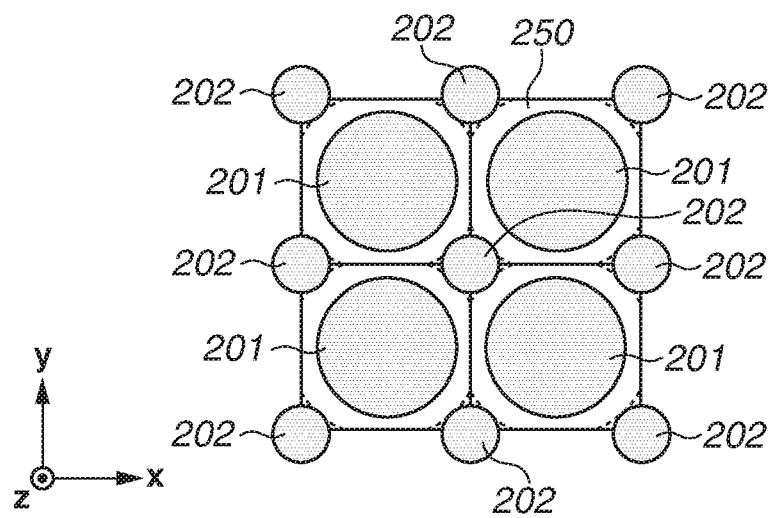
FIGS. 5A, 5B, and 5C are diagrams illustrating the exemplary embodiment.
Figure 5B:
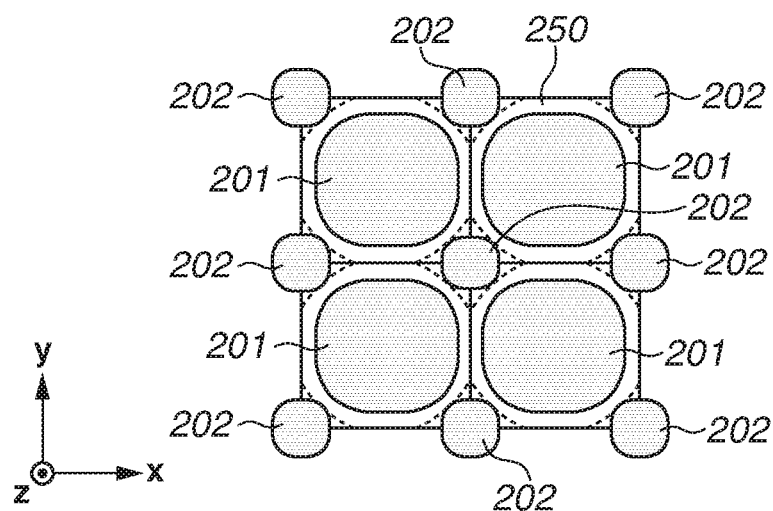
Figure 5C:
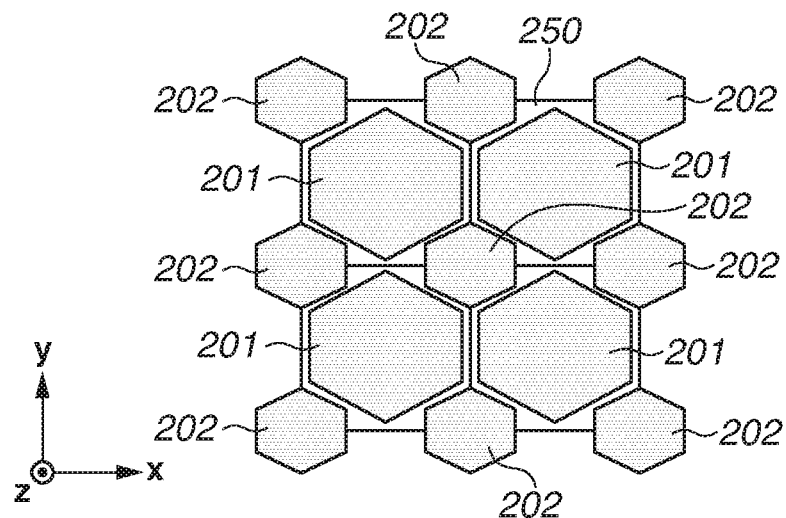

Shapes of the electrodes 201 and 202 are not limited to those illustrated in FIGS. 2 through 4. For example, each of the electrodes 201 and 202 can have a shape of a circle as illustrated in FIG. 5A, a shape in which one portion of a circle is trimmed as illustrated in FIG. 5B, a shape such as a rectangle and a hexagon as illustrated in FIG. 5C, or other polygonal shapes. Alternatively, each of the electrodes 201 and 202 can have a combination of such shapes.

Figure 3A:
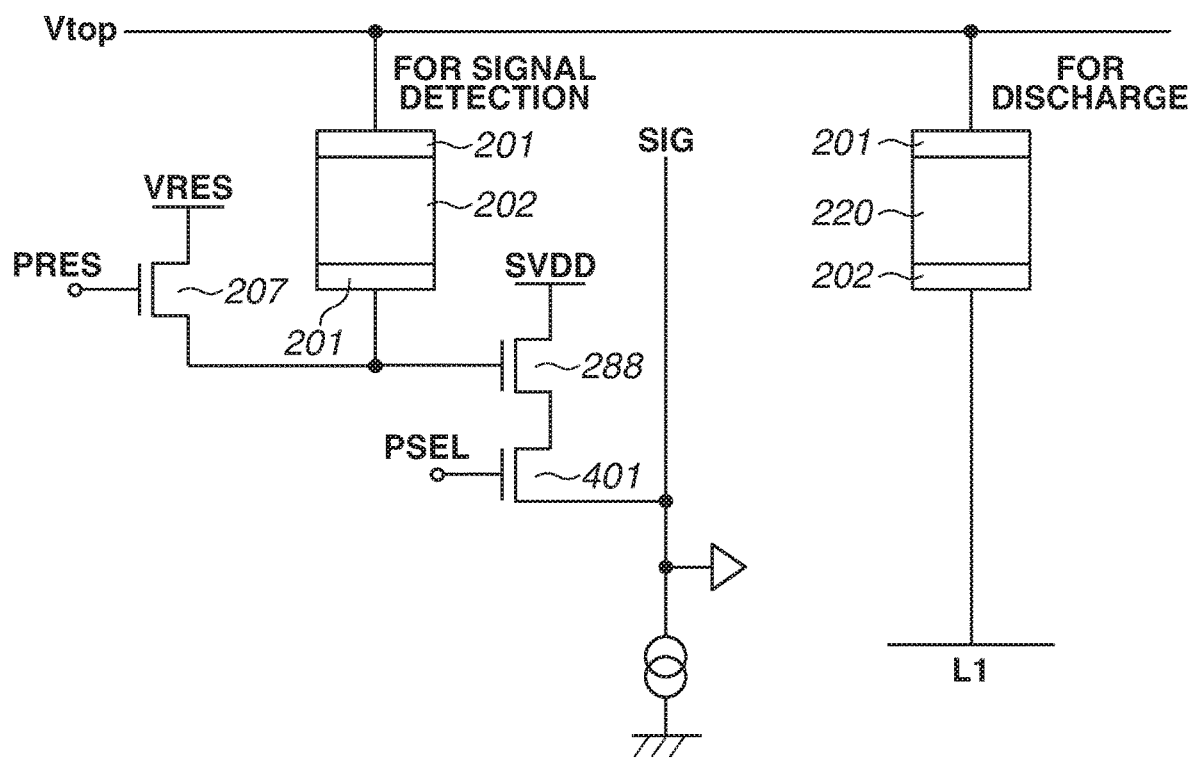
FIGS. 3A and 3B are diagrams illustrating the exemplary embodiment.
Figure 3B:
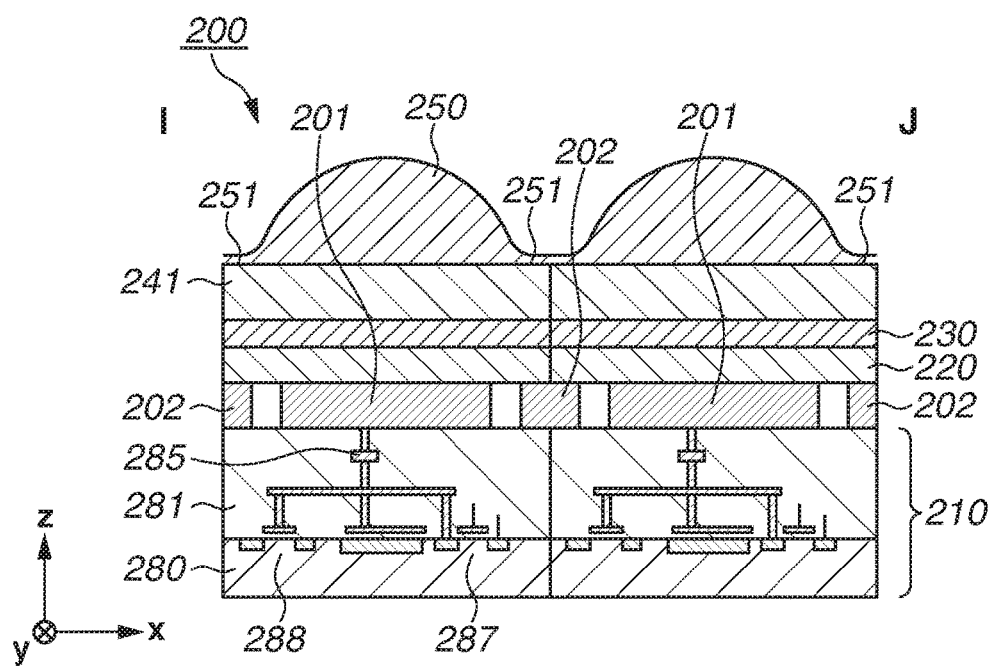
Figure 6:
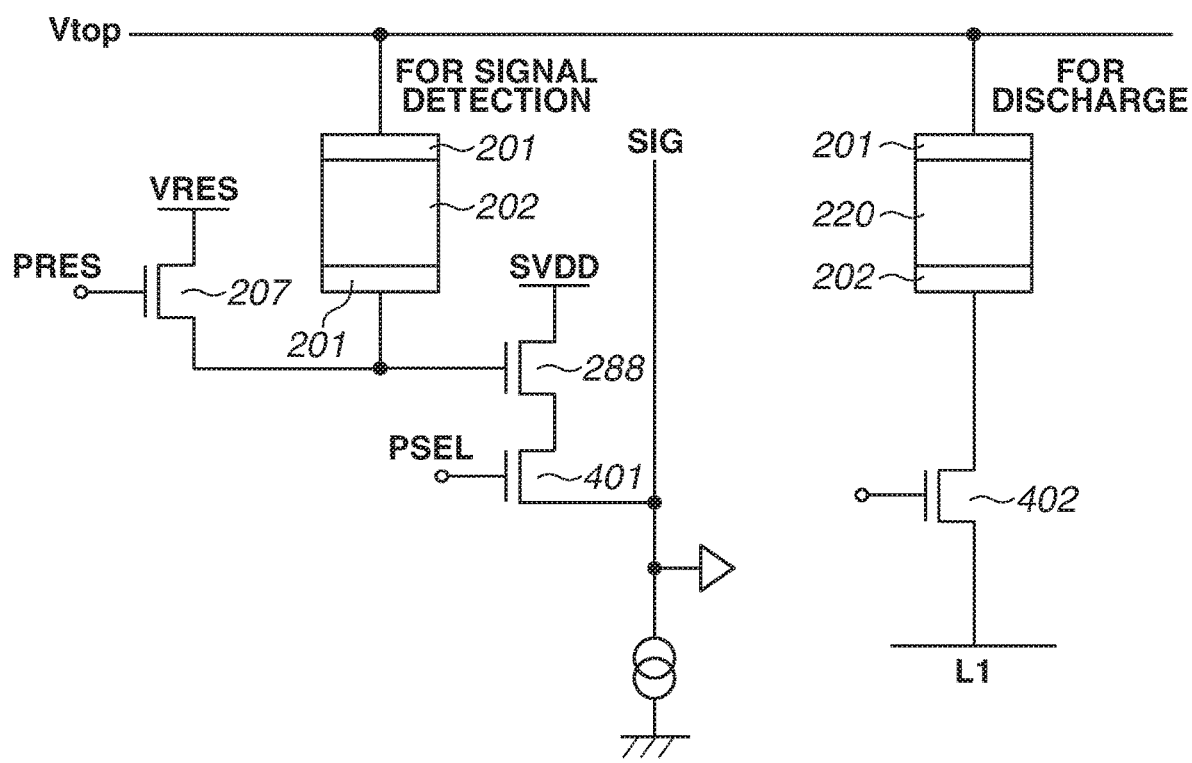
FIG. 6 is a diagram illustrating the exemplary embodiment.

In the example illustrated in FIG. 3A, the electrode 202 for discharge is directly connected to the wiring L1. However, as illustrated in FIG. 6, the electrode 202 for discharge can be connected to the wiring L1 via a switch element 402.

With the switch element 402, a discharge amount from the electrode 202 becomes adjustable, and sensitivity can be adjusted.

FIGS. 7A through 7D illustrate changes in electric charge collection areas 260 and 261 by changing voltages to be applied to the electrodes 201 and 202. The electric charge collection areas 260 and 261 are areas in which electric charges generated in the photoelectric conversion film 220 are collected. Herein, the electric charge collection area 260 is an area in which an electric charge is collected by the electrode 201, whereas the electric charge collection area 261 is an area in which an electric charge is collected by the electrode 202.

FIG. 7A illustrates a case where the electric charge collection area 260 is widened, and FIG. 7B illustrates a case where electric charge collection area 260 is narrowed. A change in a voltage of the electrode 201 that acquires an imaging signal can change sensitivity. Moreover, sensitivity to oblique incidence can be changed. For example, a change in a voltage of the wiring VRES to which the other end of the reset transistor 287 is connected changes a voltage of the electrode 201. An increase in a potential difference between the electrode 201 and the counter electrode 230 increases the electric charge collection area 260.

FIG. 7C illustrates a case where the electric charge collection area 260 is widened, and FIG. 7D illustrates a case where the electric charge collection area 260 is narrowed. A voltage of the electrode 202 for discharging an electric charge is changed, so that an area of an electric charge to be discharged can be adjusted with respect to light that has entered the gap 251 of the microlens 250. An increase in a potential difference between the electrode 202 and the counter electrode 230 increases the electric charge collection area 260.

Figure 8:
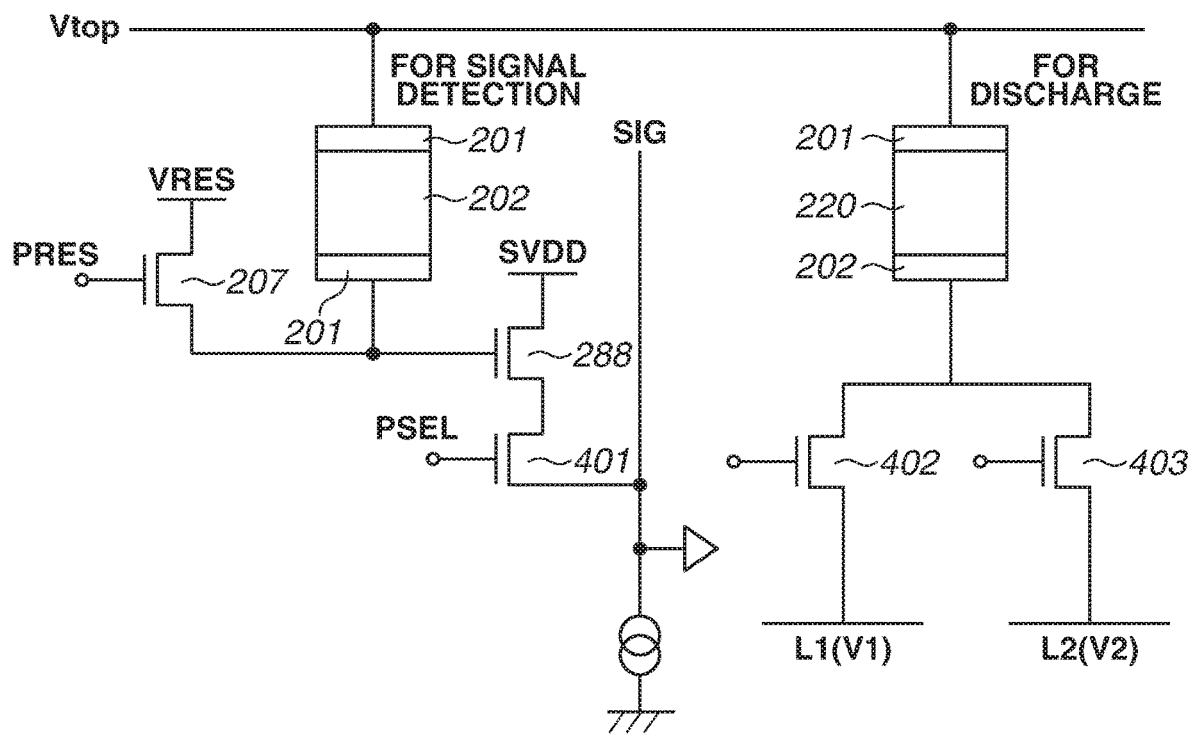
FIG. 8 is a diagram illustrating the exemplary embodiment.

FIG. 8 illustrates an example of a configuration in which a voltage to be applied to the electrode 202 can be changed. A description of a component similar to that illustrated in FIG. 3A is omitted. The electrode 202 is connected via the switch element 402 to a wiring L1 that supplies a potential V1. Moreover, the electrode 202 is connected via a switch element 403 to a wiring L2 that supplies a potential V2 higher than the potential V1. With such a configuration, control of the switch elements 402 and 403 can change a voltage to be applied to the electrode 202.

Sizes of the electric charge collection areas 260 and 261, for example, can be gradually changed as the electric charge collection areas 260 and 261 become closer to the periphery of the pixel 200 from the center of the pixel 200 in the photoelectric conversion film 220.

The configuration of the present exemplary embodiment can prevent a color mixture while having sensitivity.

Figure 9A:
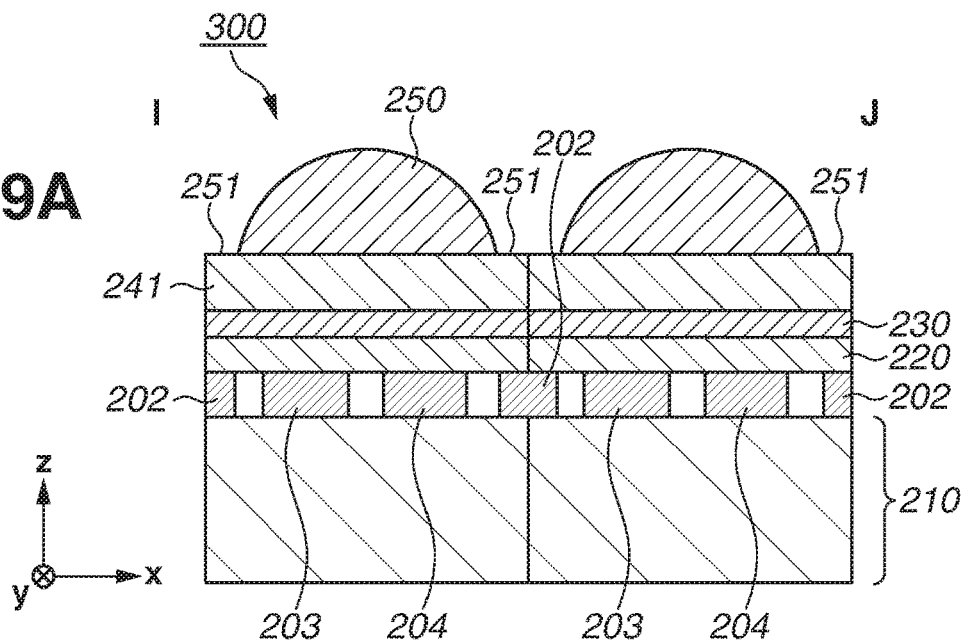
FIGS. 9A, 9B, and 9C are diagrams illustrating the exemplary embodiment.
Figure 9B:
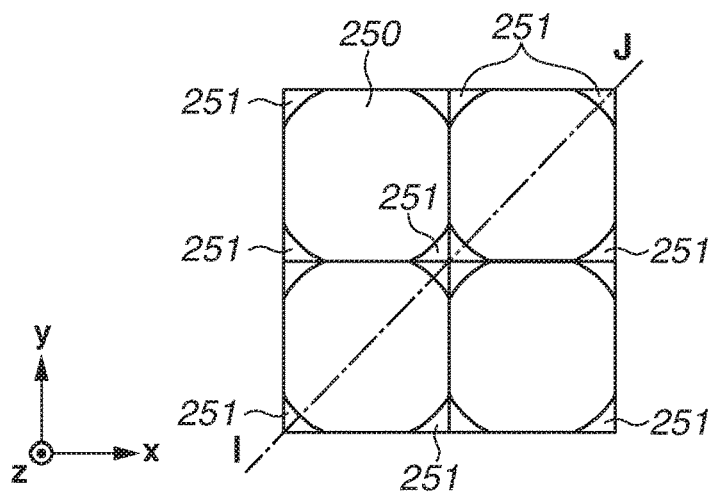
Figure 9C:
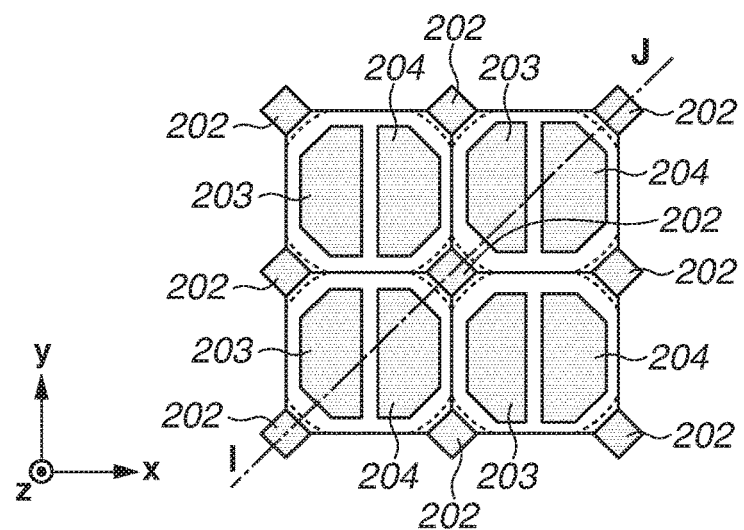

A second exemplary embodiment is hereinafter described. The present exemplary embodiment is described with reference to FIGS. 9A through 9C and 10. FIG. 9B is a top view (an x-y surface) of a microlens 250. FIG. 9C is a top view (an x-y surface) of electrodes 201 and 202. In FIG. 9C, the microlens 250 is indicated by a broken line. The sectional view illustrated in FIG. 9A corresponds to a surface along the dashed line I-J of each of FIGS. 9B and 9C.

A pixel 300 of the present exemplary embodiment differs from the pixel 200 of the first exemplary embodiment in that the electrode 201 is divided into two electrodes 203 and 204. The division of the electrode 201 into the electrodes 203 and 204 enables detection of a potential difference in a direction x illustrated in FIG. 8. Accordingly, focus detection and focusing can be performed. Signals from the electrodes 203 and 204 can be used as signals for focus detection or signals for focusing.

Figure 10A:
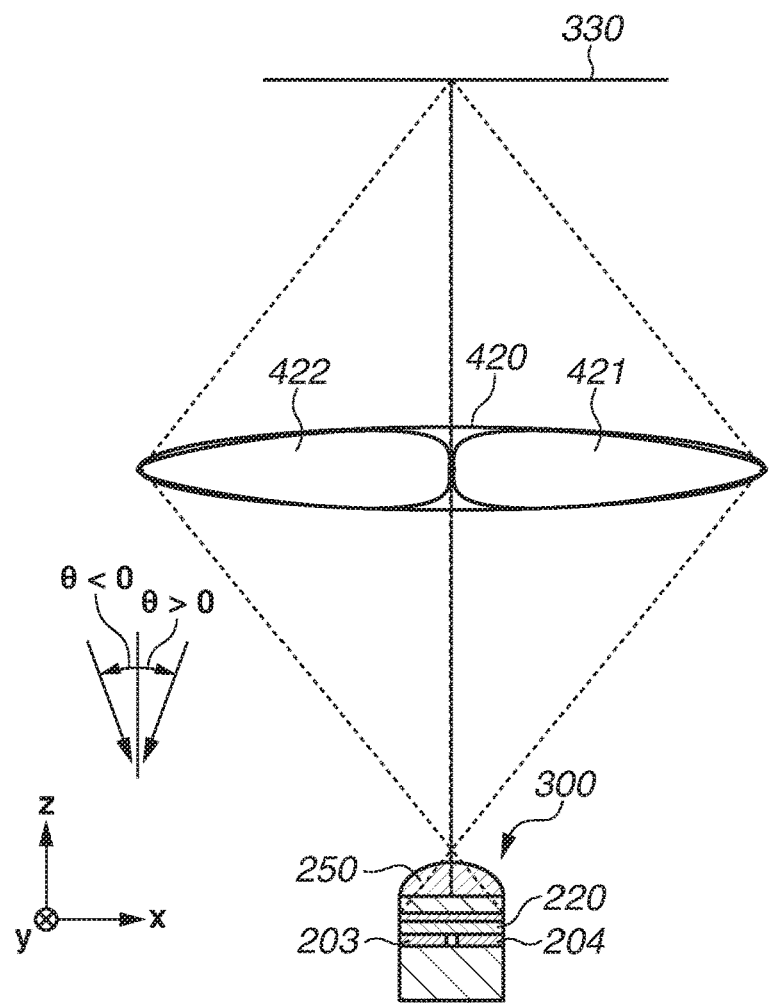
FIGS. 10A and 10B are diagrams illustrating the exemplary embodiment.
Figure 10B:
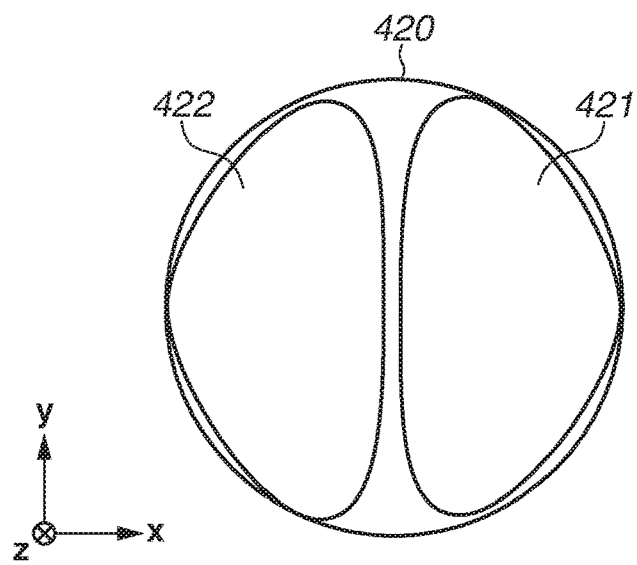

FIG. 10A illustrates a relation between the pixel 300, an object 330, and an exit pupil 420 of an image capturing lens. FIG. 10B is a plan view (an x-y surface) of the exit pupil 420. In FIGS. 10A and 10B, a direction x indicates a pupil dividing direction, and each of pupil areas 421 and 422 is a divided area of the exit pupil 420. The exit pupil 420 and the photoelectric conversion film 220 have a conjugate relation via a microlens 250.

Light that has passed the pupil area 421 generates an electric charge in an upper portion positioned on the electrode 203 in a photoelectric conversion film 220. Moreover, light that has passed the pupil area 422 generates an electric charge in a lower portion positioned on the electrode 203 in the photoelectric conversion film 220. Two parallax images can be acquired from a signal charge collected by the electrode 203 and a signal charge collected by the electrode 204, and focus detection by a phase difference can be performed. Moreover, focusing can be performed.

In FIG. 9, the electrode 202 for discharge is arranged in a diagonal direction with respect to the electrodes 203 and 204, and is not arranged in the direction x. Thus, light can be widely captured in the direction x, and an angular range for focus detection can be expanded. Moreover, since an electric charge generated by light entering from the gap 251 of the microlens 250 is discharged from the electrode 202, a pseudo signal that causes degradation in focus detection performance and focusing performance can be eliminated.

Moreover, an electric charge can be read out by another method by which electric charges are discharged from the electrodes 204 and 202, and an electric charge is read out from the electrode 203. Subsequently, after electric charges are accumulated again, the electric charges may be discharged from the electrodes 203 and 202, and an electric charge may be read out from the electrode 204. In the photoelectric conversion film 220, an electric charge to be generated in an area overlapping with the gap 251 in a plan view is further discharged. Hence, focus detection performance and focusing performance can be enhanced.

Figure 11A:
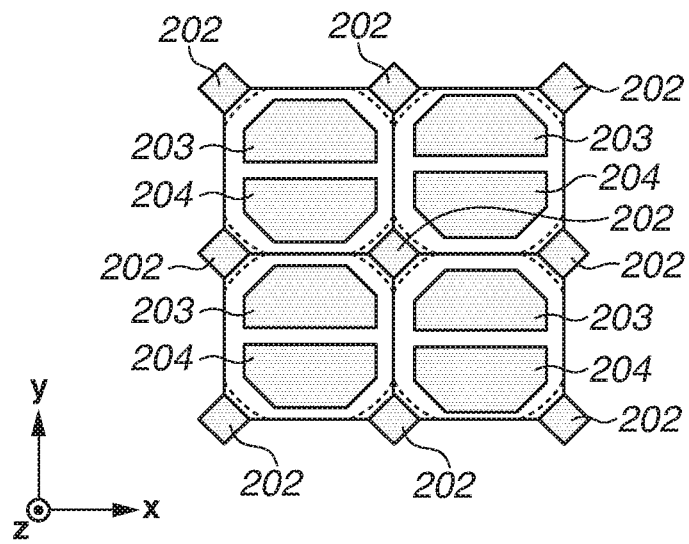
FIGS. 11A and 11B are diagrams illustrating the exemplary embodiment.
Figure 11B:
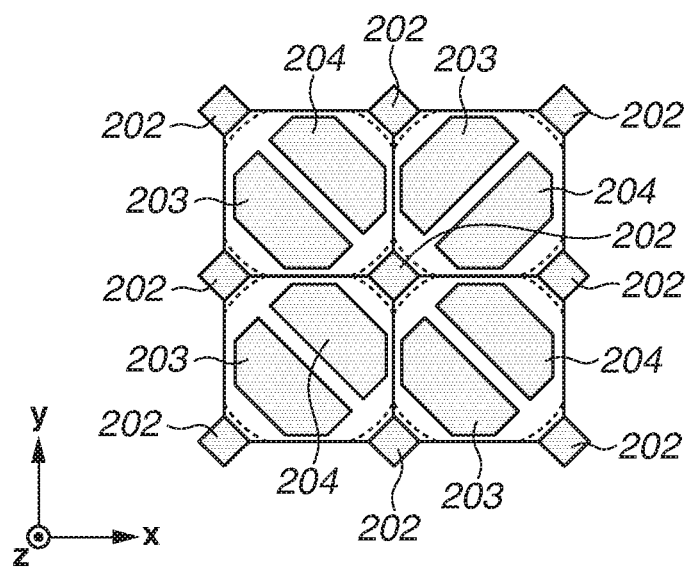

Each of the electrodes 203 and 204 is not limited to that illustrated in FIG. 9. For example, each of the electrodes 203 and 204 can be divided in a longitudinal direction as illustrated in FIG. 11A. Such longitudinal division enables focus detection to be performed in a direction y illustrated in FIG. 11A. Moreover, an electrode can be divided in a diagonal direction as illustrated in FIG. 11B. Such diagonal division enables focus detection to be performed in a diagonal direction. Moreover, focus detection can be performed in a direction x and a direction y at the same time.

Moreover, shapes of the electrodes 203 and 204 can be, for example, shapes that are acquired by dividing the electrode 201 illustrated in FIG. 5 into two. Further, as described with reference to FIGS. 7 and 8 in the first exemplary embodiment, a change in a voltage to be applied to each of the electrodes 203 and 204 can change an electric charge collection area. For example, a voltage to be applied to each of the electrodes 203 and 204 can be gradually changed as the electric charge collection area comes closer to the periphery of a pixel area from the center of the pixel area. Hence, a position of a border between the electric charge collection areas of the electrodes 203 and 204 is changed, and desired focus detection can be performed with respect to an incident angle of an image capturing lens.

Figure 12A:
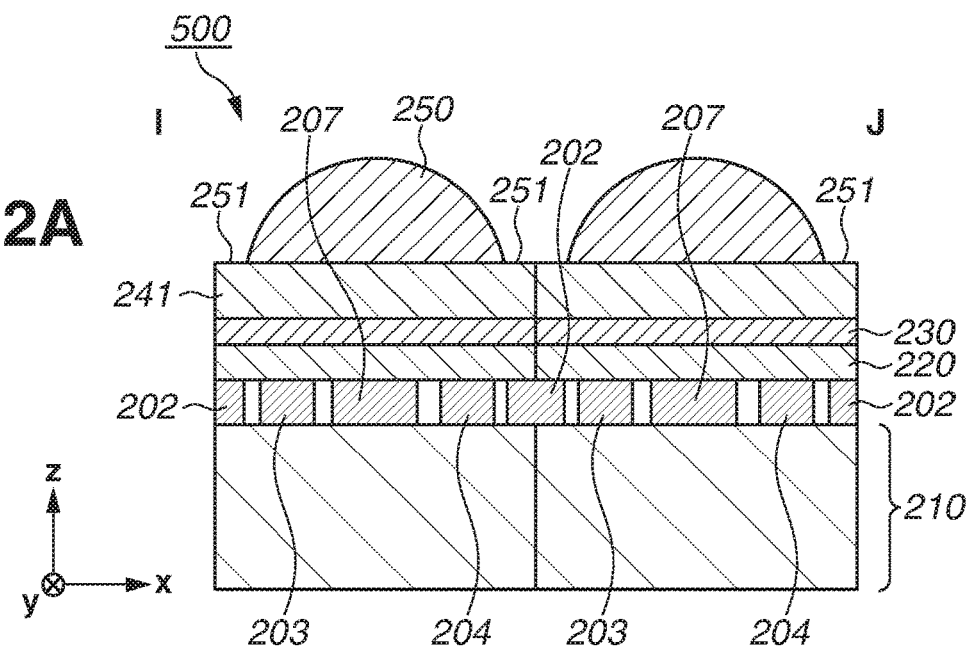
FIGS. 12A, 12B, and 12C are diagrams illustrating the exemplary embodiment.
Figure 12B:
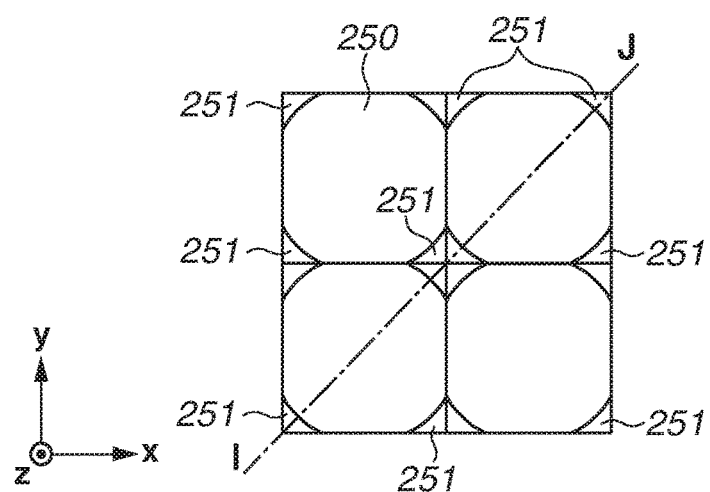
Figure 12C:
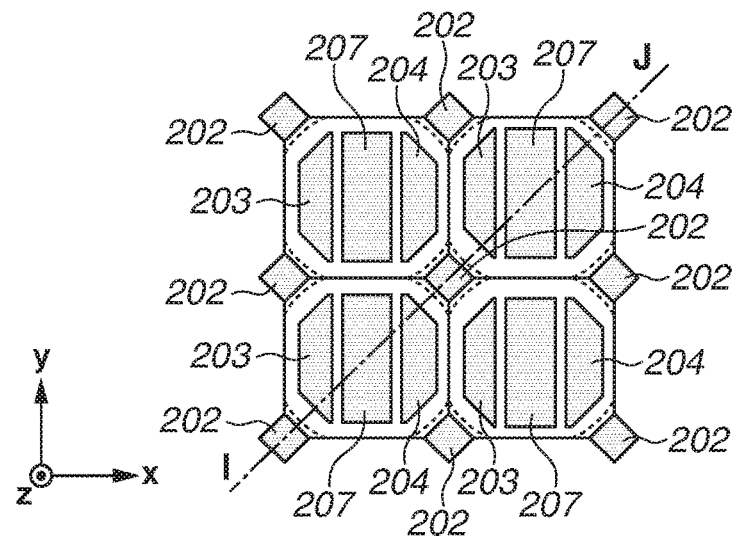

A third exemplary embodiment is described with reference to FIGS. 12A through 12C, 13A and 13B. FIG. 12B is a top view (an x-y surface) of a microlens 250. FIG. 12C is a top view (an x-y surface) of electrodes 201 and 202. In FIG. 12C, the microlens 250 is indicated by a broken line. The sectional view illustrated in FIG. 12A corresponds to a surface along the dashed line I-J of each of FIGS. 12B and 12C.

A pixel 500 of the present exemplary embodiment has a configuration that is provided by dividing the electrode 201 in the pixel 200 of the first exemplary embodiment into three electrodes of electrodes 203, 204, and 207. The electrodes 203 and 204 of the present exemplary embodiment are more separated than those in the second exemplary embodiment, and the pupil areas 421 and 422 described with reference to FIG. 10 are separated, so that a parallax is increased, and focus detection performance is enhanced. Moreover, if only the electrode 207 is read out, the light concentrated in a direction x is captured. Thus, a captured image having a depth of field that is greater in the direction x than that in the first and second exemplary embodiments can be acquired. If an electric charge is read out from only the electrode 207, electric charges may be discharged from the electrodes 203, 204, and 202.

Moreover, the electrodes 203, 204, and 207 can be separately read out, so that the readouts can be used as respective parallax images. Moreover, the electrodes 203, 204, and 207 can be simultaneously read out, so that a signal of a combined imaging pixel can be provided.

Figure 13A:
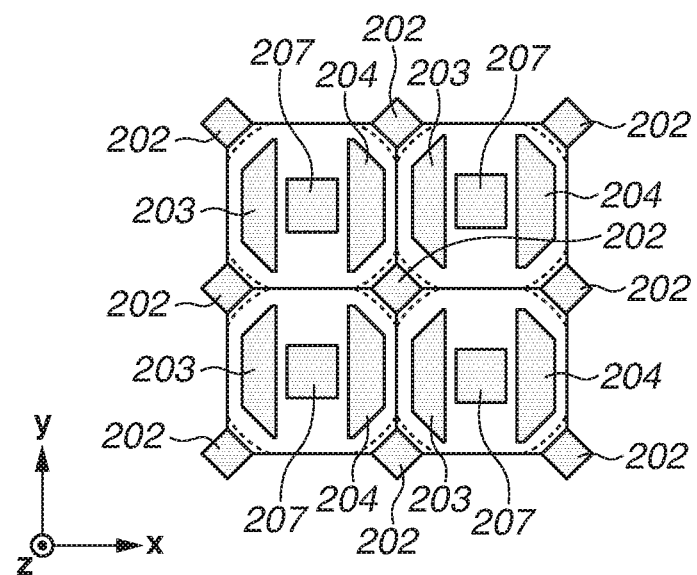
FIGS. 13A and 13B are diagrams illustrating the exemplary embodiment.

Shapes of the electrodes 203, 204, and 207 are not limited to those illustrated in FIG. 12. The electrode 207 can have a shape with reduced size in a direction y as illustrated in FIG. 13A. If a signal of only the electrode 207 illustrated in FIG. 13A is read out, the light concentrated in directions x and y is captured. Thus, a captured image having an increased depth of field can be acquired.

Figure 13B:
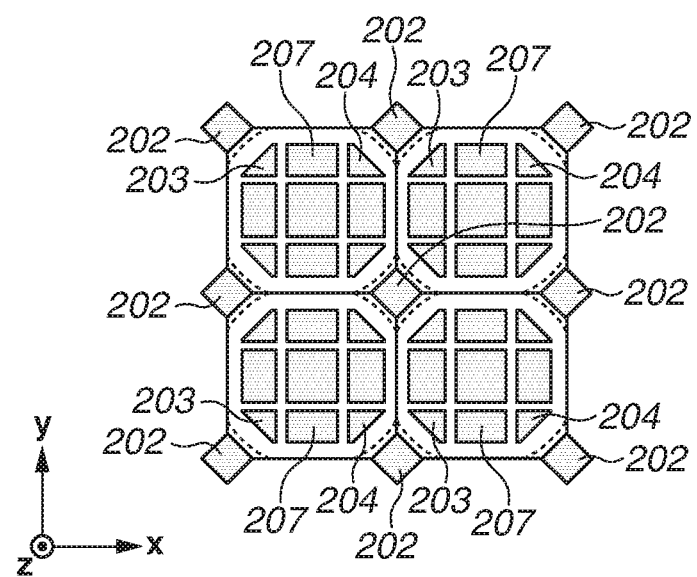

As illustrated in FIG. 13B, the electrodes 203, 204, and 207 may have shapes that are divided into a plurality of segments in the direction y. Thus, focus detection can be performed not only in the direction x in FIG. 12, but also in the direction y. Moreover, only one part of each of the electrodes 203, 204, and 207 may be read out. In such a case, the only one part of each of the electrodes 203, 204, and 207 can be used as a discharge electrode.

(Image Capturing System According to Exemplary Embodiment)

Hereinafter, a fourth exemplary embodiment is described. The present exemplary embodiment is an example of an image capturing system using the image capturing apparatus including the focusing pixel and the imaging pixel described in the above exemplary embodiment. The image capturing system is used, for example, as an on-vehicle camera.

Figure 14:
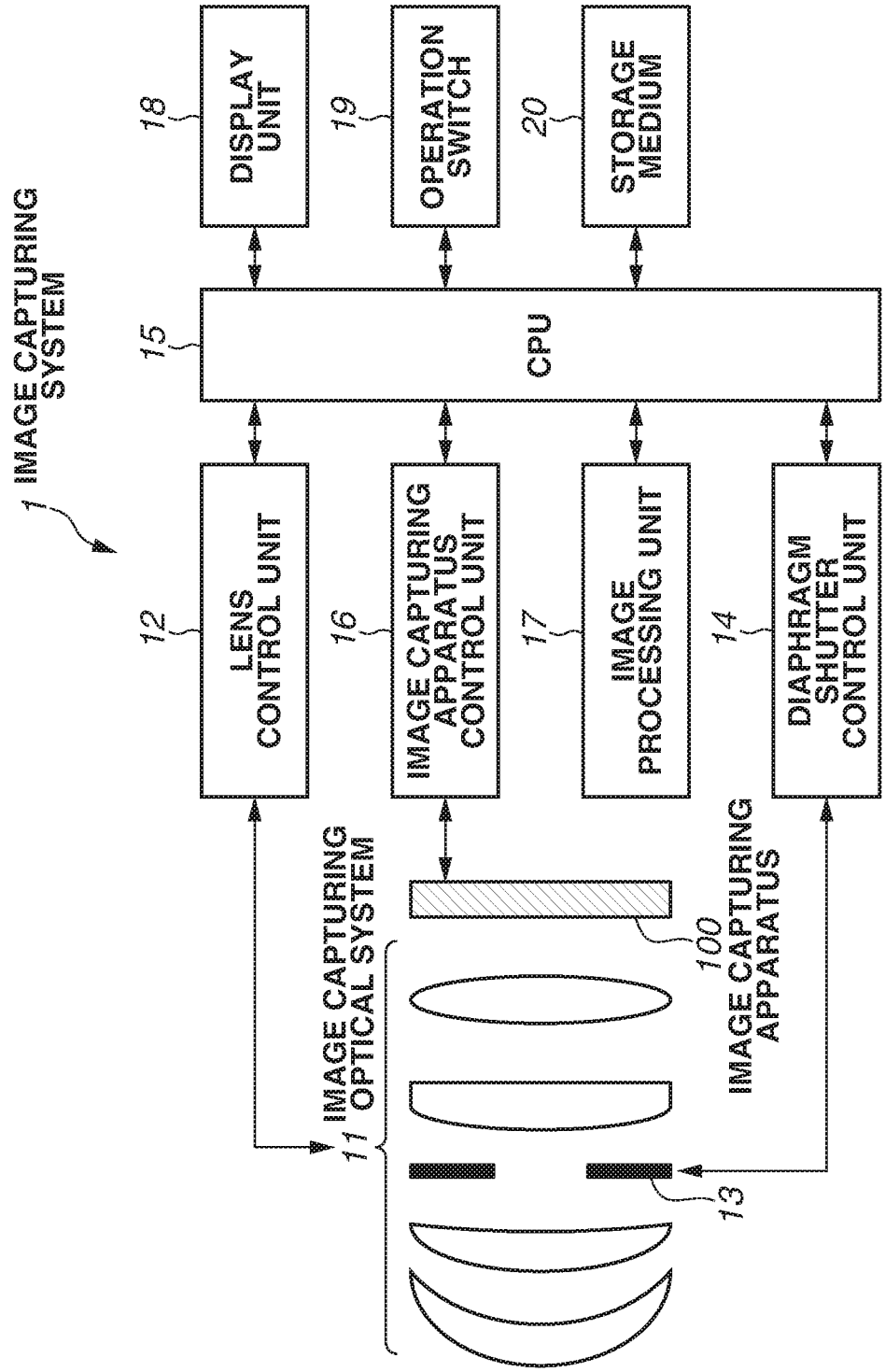
FIG. 14 is a diagram illustrating an image capturing system according to an exemplary embodiment.

FIG. 14 illustrates a configuration of an image capturing system 1. The image capturing system 1 includes the image capturing apparatus 100, a processing unit 21, a display unit 18, an operation switch 10, and a storage medium 20. The processing unit 21 includes, for example, a lens control unit 12, an image capturing apparatus control unit 16, an image processing unit 17, and a shutter control unit 14. The processing unit 21 processes a signal from the image capturing apparatus 100.

An image capturing lens that is an image capturing optical system 11 is attached to the image capturing system 1. The image capturing optical system 11 controls a focus position by using the lens control unit 12. A diaphragm 13 is connected to the shutter control unit 14 to adjust an amount of light by changing a diameter of an aperture in the diaphragm 13.

In an image space of the image capturing optical system 11, an imaging plane of the image capturing apparatus 100 is arranged to acquire an object image formed by the image capturing optical system 11. A central processing unit (CPU) 15 controls various operations of a camera as a controller. The CPU 15 includes a calculation unit, a read only memory (ROM), a random access memory (RAM), an analog-to-digital (A/D) converter, a digital-analog (D/A) converter, and a communication interface circuit. The CPU 15 controls an operation of each unit inside the camera according to a computer program stored in the ROM, thereby executing a series of image capturing operations. The series of image capturing operations includes an automatic focus (AF) operation including measurement of a distance to an object and detection (focus detection) of a focus state of the image capturing optical system, an image capturing operation, an image processing operation, and a recording operation.

The CPU 15 corresponds to a signal processing unit. The image capturing apparatus control unit 16 not only controls an operation of the image capturing apparatus 100, but also transmits a pixel signal (an imaging signal) output from the image capturing apparatus 100 to the CPU 15. The image processing unit 17 performs image processing such as γ-conversion and color interpolation on the imaging signal to generate an image signal. The image signal is output to the display unit 18 such as a liquid crystal display (LCD). The CPU 15 is operated using an operation switch 19, and a captured image is recorded in a detachable storage medium 20.

(On-Vehicle Image Capturing System According to Exemplary Embodiment)

Figure 15A:
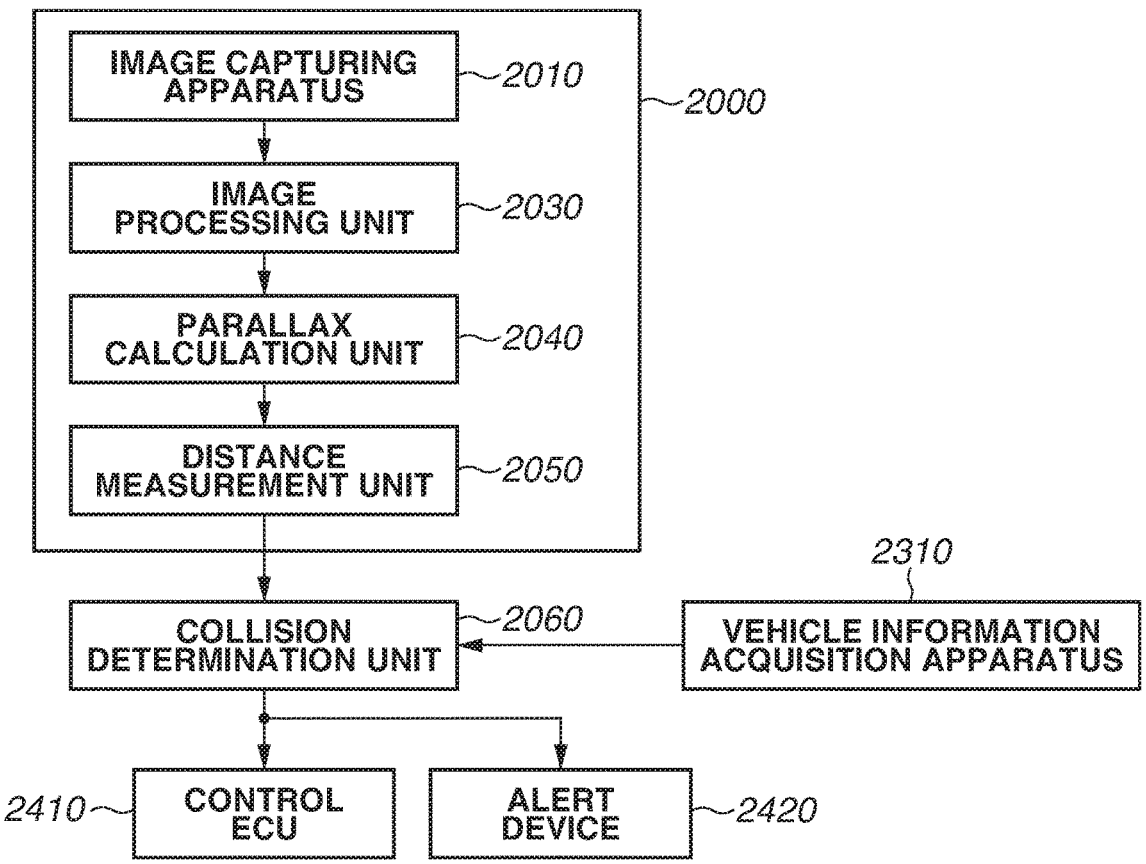
FIGS. 15A and 15B are diagrams each illustrating the image capturing system according to the exemplary embodiment.
Figure 15B:
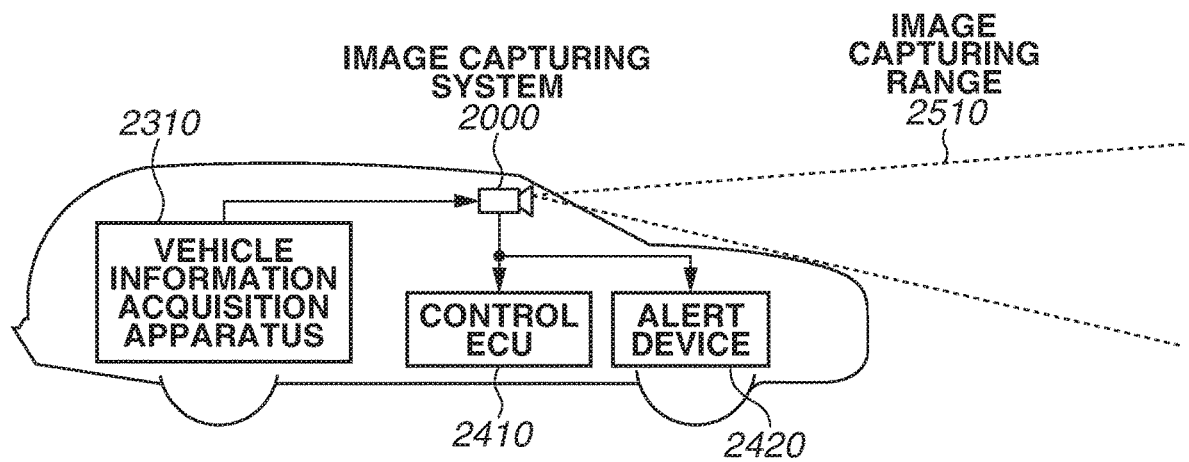

Each of FIGS. 15A and 15B illustrates one example of an image capturing system related to the on-vehicle camera. An image capturing system 2000 includes a focusing pixel and an imaging pixel according to the present exemplary embodiment. The image capturing system 2000 includes an image processing unit 2030 that performs image processing on a plurality of pieces of image data acquired by an image capturing apparatus 2010. Moreover, the image capturing system 2000 includes a parallax calculation unit 2040 that calculates a parallax (a phase difference of parallax images) from a plurality of pieces of image data acquired from the image capturing system 2000. As for the image capturing apparatus 2010, the image capturing apparatus described in the above exemplary embodiment can be used.

Moreover, the image capturing system 2000 includes a distance measurement unit 2050 that calculates a distance to a target object based on the calculated parallax, and a collision determination unit 2060 that determines whether there is a possibility of collision based on the calculated distance. Herein, each of the parallax calculation unit 2040 and the distance measurement unit 2050 is one example of a distance information acquisition unit that acquires distance information up to a target object. That is, the distance information is information about a parallax, a defocus amount, and a distance to a target object. The collision determination unit 2060 can use any of such distance information to determine a collision possibility.

The distance information acquisition unit can be realized by hardware designed for and dedicated to acquisition of distance information or realized by a software module. Alternatively, the distance information acquisition unit can be realized by, for example, a field programmable gate array (FPGA), and an application specific integrated circuit (ASIC), or a combination of the FPGA and the ASIC.

The image capturing system 2000 is connected to a vehicle information acquisition apparatus 2310. Thus, the image capturing system 2000 can acquire vehicle information such as vehicle speed, yaw rate, and rudder angle. Moreover, a control electronic control unit (control ECU) 2410 is connected to the image capturing system 2000. The control ECU 2410 as a control device outputs a control signal for generating a braking force with respect to a vehicle based on a determination result determined by the collision determination unit 2060. That is, the control ECU 2410 is one example of a moving body control unit that controls a moving body based on distance information. The image capturing system 2000 is also connected to an alert device that issues an alert to a driver based on a determination result determined by the collision determination unit 2060. For example, if a collision possibility is high based on a result determined by the collision determination unit 2060, the control ECU 2410 controls a vehicle to prevent a collision or reduce damage by braking the vehicle, releasing an accelerator, or suppressing an engine output. The alert device 2420 issues an alert such as sound, displays alert information on a screen such as a car navigation system, or vibrates a seat belt or a steering wheel to alert the user to a situation.

In the present exemplary embodiment, the image capturing system 2000 captures an image of the periphery of a vehicle, for example, the front or the read of the vehicle. FIG. 15B illustrates the image capturing system 2000 if an image of the front of the vehicle (an image capturing range 2510) is captured. The vehicle information acquisition apparatus 2310 transmits an instruction such that the image capturing system 2000 executes image capturing. The use of the image capturing apparatus 100 according to the above-described first, second, or third exemplary embodiment as the image capturing apparatus 2010 enables the image capturing system 2000 of the present exemplary embodiment to further enhance the accuracy of focusing.

The present exemplary embodiment has been described using an example in which control is performed such that a vehicle does not collide with another vehicle. However, the present exemplary embodiment can also be applied to control of automatic operation by following another vehicle, and control of automatic operation such that a vehicle does not stray off a traffic lane. Moreover, application of the image capturing system is not limited to a vehicle such as an automobile. The image capturing system can be applied to, for example, a vessel, an aircraft, or a moving body (a moving apparatus) such as an industrial robot. In addition, the image capturing system can be applied to not only the moving body, but also equipment that widely uses object recognition. An example of such equipment is an intelligent transportation system (ITS).

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-245451, filed Dec. 21, 2017, which is hereby incorporated by reference herein in its entirety.

What is claimed is:
1. An image capturing apparatus comprising:
a plurality of pixels; and
a plurality of discharge electrodes,
wherein each of the plurality of pixels includes:
a first electrode arranged on a member including a multilayer wiring layer;

a photoelectric conversion film arranged on the first electrode;

a second electrode arranged on the photoelectric conversion film; and a microlens arranged on the second electrode and in a position that overlaps with the first electrode in a plan view, wherein, between microlenses included in adjacent two pixels of the plurality of pixels, a gap is formed in the plan view, and wherein the discharge electrode is arranged in a position that overlaps with the gap in the plan view.

2. The image capturing apparatus according to claim 1, wherein the discharge electrode is arranged between the member and the photoelectric conversion film.

3. The image capturing apparatus according to claim 1, wherein the first electrode is connected to a gate of an amplification transistor, and wherein the discharge electrode is directly connected to a first wiring having a first potential.

4. The image capturing apparatus according to claim 1, wherein the first electrode is connected to a gate of an amplification transistor, and wherein the discharge electrode is connected to a first wiring having a first potential via a first switch element.

5. The image capturing apparatus according to claim 4, wherein the discharge electrode is connected via a second switch element to a second wiring having a second potential different from the first potential.

6. The image capturing apparatus according to claim 1, wherein the first electrode is not arranged in a position that overlaps with the gap in the plan view.

7. The image capturing apparatus according to claim 1, wherein, in the plan view, the discharge electrode is arranged in a position that does not overlap with the microlens.

8. The image capturing apparatus according to claim 1, wherein, in the plan view, the second electrode is arranged in a position that overlaps with a part of the microlens.

9. The image capturing apparatus according to claim 1, wherein, in the plan view, the first electrode has a polygonal shape.

10. The image capturing apparatus according to claim 1, further comprising a third electrode arranged on the member and in a position that overlaps with the microlens in the plan view.

11. The image capturing apparatus according to claim 10, wherein signals from the first electrode and the third electrode are signals for focusing or signals for focus detection.

12. The image capturing apparatus according to claim 10, further comprising a fourth electrode between the first electrode and the third electrode in the plan view.

13. The image capturing apparatus according to claim 12, wherein a signal from the fourth electrode is a signal for image formation.

14. The image capturing apparatus according to claim 1, wherein the first electrode configured to change an amount of voltage to be applied to the first electrode is connected to one terminal of a reset transistor, and another terminal of the reset transistor is connected to a third wiring to change a potential of the third wiring.

15. The image capturing apparatus according to claim 1, wherein the first electrode is connected to one terminal of a reset transistor, and another terminal of the reset transistor is connected to a third wiring to change a potential of the third wiring.

16. An image capturing system comprising:

the image capturing apparatus according to claim 1; and a processing unit configured to process a signal from the image capturing apparatus.

* * * * *